(12) United States Patent
Bates et al.

(10) Patent No.: US 7,916,609 B2
(45) Date of Patent: Mar. 29, 2011

(54) APPARATUS AND METHOD FOR HOLOGRAPHIC INFORMATION STORAGE AND RETRIEVAL

(75) Inventors: Allen Keith Bates, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 632 days.

(21) Appl. No.: 11/627,300

(22) Filed: Jan. 25, 2007

(65) Prior Publication Data
US 2008/0181082 A1  Jul. 31, 2008

(51) Int. Cl.
*G11B 7/0065* (2006.01)
(52) U.S. Cl. .................................................. 369/103
(58) Field of Classification Search .................. None
See application file for complete search history.

(56) References Cited

U.S. PATENT DOCUMENTS

| 4,420,829 A | * | 12/1983 | Carlson .................... 369/103 |
| 5,982,513 A | | 11/1999 | Zhou et al. |
| 6,285,474 B1 | * | 9/2001 | Kawano et al. ............ 359/29 |
| 7,012,722 B2 | * | 3/2006 | Ogasawara ............... 359/30 |
| 2005/0002310 A1 | | 1/2005 | Song et al. |
| 2005/0018263 A1 | | 1/2005 | Pharris |
| 2008/0106994 A1 | * | 5/2008 | Lan et al. ................. 369/103 |

* cited by examiner

*Primary Examiner* — Wayne R Young
*Assistant Examiner* — Brian Butcher
(74) *Attorney, Agent, or Firm* — Dale F. Regelman; Quarles & Brady LLP

(57) ABSTRACT

A method for holographic information storage and retrieval is disclosed. The method supplies a holographic data storage system comprising a light source and a holographic data storage medium and provides information to the holographic data storage system. The method generates a reference beam using the light source, forms a data beam comprising a data image and an orientation image, wherein the data image comprises all or a portion of the information. The method then generates a hologram using the data beam and the write reference beam, and encodes the hologram in the holographic data storage medium to form an encoded holographic data storage medium.

20 Claims, 15 Drawing Sheets

1300

1400

1500

APPARATUS AND METHOD FOR HOLOGRAPHIC INFORMATION STORAGE AND RETRIEVAL

FIELD OF THE INVENTION

This invention relates to an apparatus and method for holographic information storage and retrieval.

BACKGROUND OF THE INVENTION

In holographic information storage, an entire page of information is stored at once as an optical interference pattern within a thick, photosensitive optical material. This is done by intersecting two coherent laser beams within the storage material. The first, called the data beam, contains the information to be stored; the second, called the reference beam, is designed to be simple to reproduce, for example a simple collimated beam with a planar wavefront.

The resulting optical interference pattern causes chemical and/or physical changes in the photosensitive medium: a replica of the interference pattern is stored as a change in the absorption, refractive index, or thickness of the photosensitive medium. When the stored interference pattern is illuminated with one of the two waves that were used during recording, some of this incident light is diffracted by the stored interference pattern in such a fashion that the other wave is reconstructed. Illuminating the stored interference pattern with the reference wave reconstructs the data beam, and vice versa.

A large number of these interference patterns can be superimposed in the same thick piece of media and can be accessed independently, as long as they are distinguishable by the direction or the spacing of the patterns. Such separation can be accomplished by changing the angle between the object and reference wave or by changing the laser wavelength. Any particular data page can then be read out independently by illuminating the stored patterns with the reference wave that was used to store that page. Because of the thickness of the hologram, this reference wave is diffracted by the interference patterns in such a fashion that only the desired object beam is significantly reconstructed and imaged on an electronic camera. The theoretical limits for the storage density of this technique are on the order of tens of terabits per cubic centimeter.

SUMMARY OF THE INVENTION

Applicants' invention comprises a method for holographic information storage and retrieval. The method supplies a holographic data storage system comprising a light source and a holographic data storage medium. The method provides information to the holographic data storage system, provides a reference beam, and forms a data beam comprising a data image and an orientation image, wherein the data image comprises all or a portion of the information. The method then generates a hologram using the data beam and the reference beam, and encodes the hologram in the holographic data storage medium.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
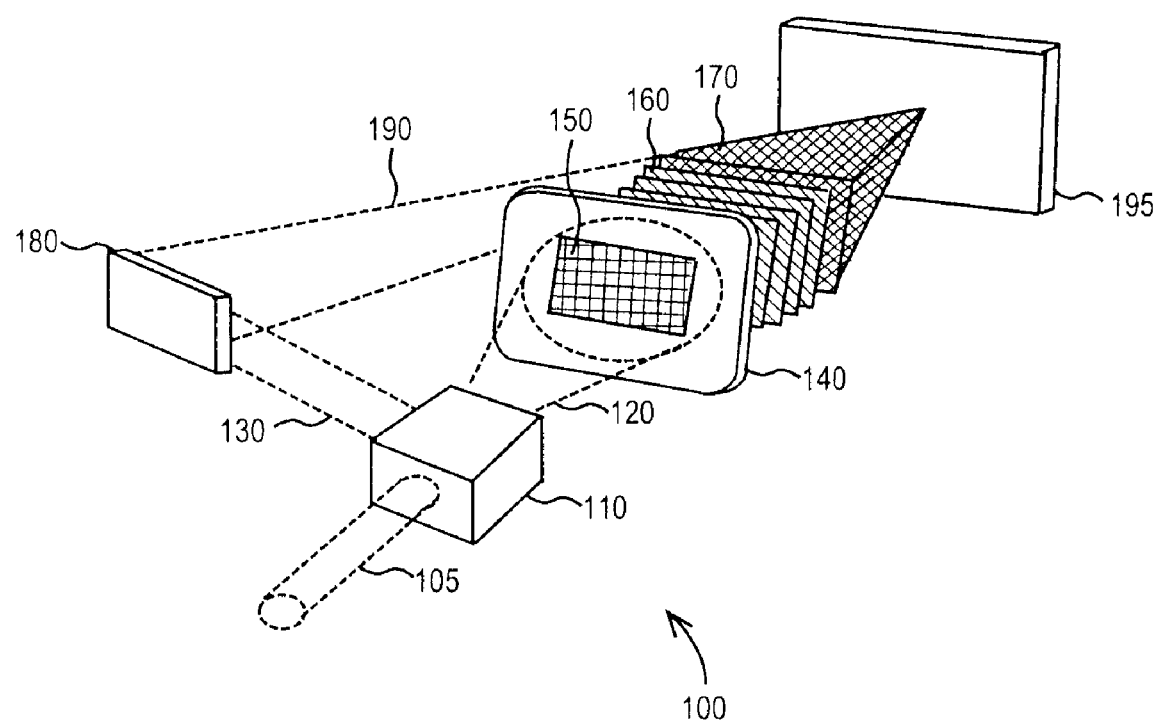
FIG. 1 is perspective view of a holographic information recording method and apparatus.

FIG. 1 illustrates a holographic information recording apparatus 100. Apparatus 100 comprises a laser light source 105, a laser beam splitter 110, carrier beam 120, and reference beam 130. In the illustrated embodiment of FIG. 1, apparatus 100 further comprises a transmissive Spatial Light Modulator ("SLM") 140, a data beam 160, a mirror 180, and a holographic data storage medium 195.

In certain embodiments, transmissive SLM 140 is an LCD-type device. Information is represented by either a light or a dark pixel on the SLM 140 display. The SLM 140 is typically translucent. Laser light originating from the laser source 105 is split by the beam splitter 110 into two beams, a carrier beam 120 and a reference beam 130. The carrier beam 120 picks up the image 150 displayed by the SLM 140 as the light passes through the SLM 140.

Reference beam 130 is reflected by the mirror 180 to produce reflected reference beam 190. Reflected reference beam 190 interferes with the data beam 160 to form hologram 170. Hologram 170 is stored in a holographic storage medium 195.

Figure 2:
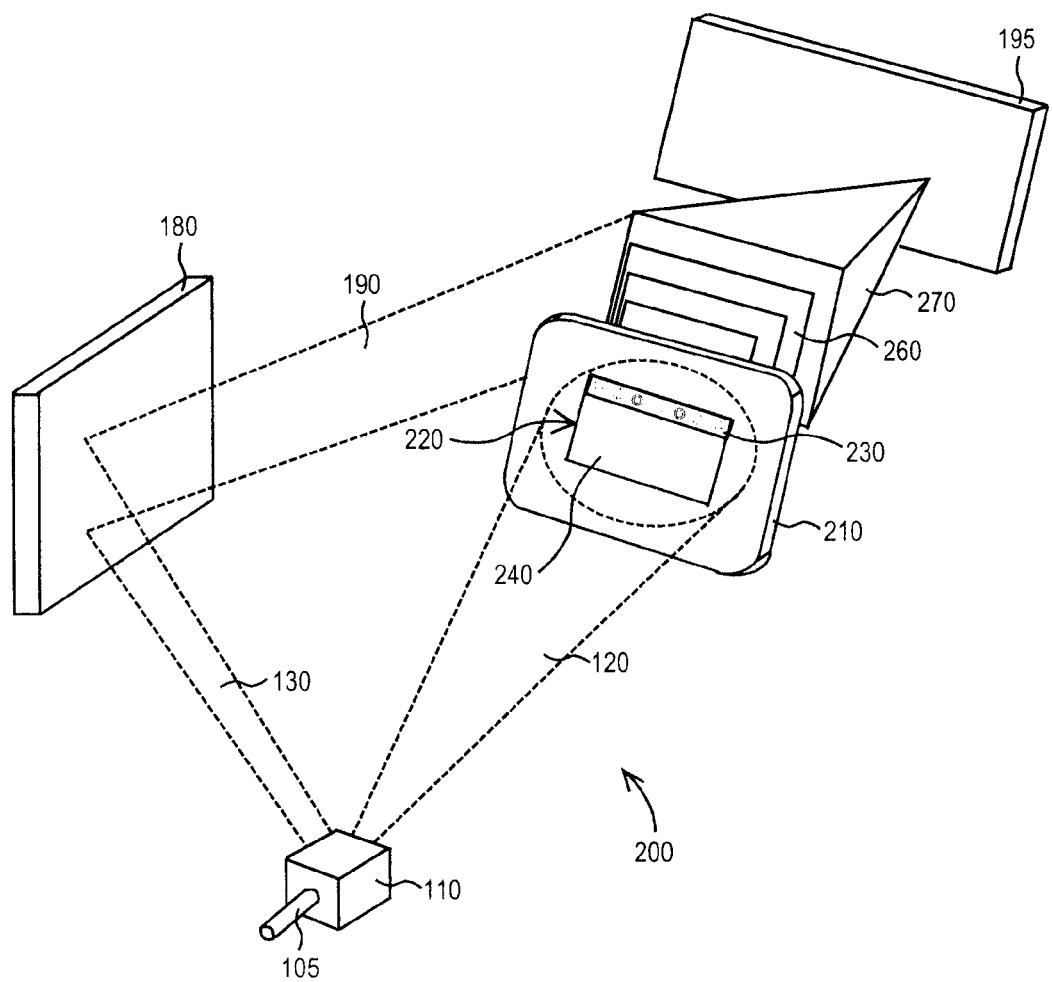
FIG. 2 is a perspective view of a first embodiment of Applicants' holographic information recording apparatus and method.

Referring now to FIG. 2, holographic information recording apparatus 200 comprises laser light source 105, a laser beam splitter 110, data carrier beam 120, and reference beam 130. In the illustrated embodiment of FIG. 2, apparatus 200 further comprises a transmissive Spatial Light Modulator ("SLM") 210, a data beam 260, a mirror 180, and a holographic data storage medium 195.

In certain embodiments, transmissive SLM 210 comprises an LCD-type device. Information is represented by either a light or a dark pixel on the SLM 210 display. The SLM 210 is typically translucent.

Laser light originating from the laser source 105 is split by the beam splitter 110 into two beams, a carrier beam 120 and a reference beam 130. The carrier beam 120 picks up the image 220 displayed by the SLM 210 as the light passes through the SLM 210 to form data beam 260. Reflected reference beam 190 interferes with the data beam 260 to form hologram 270. Hologram 270 is encoded in a holographic storage medium 195.

Figure 7:
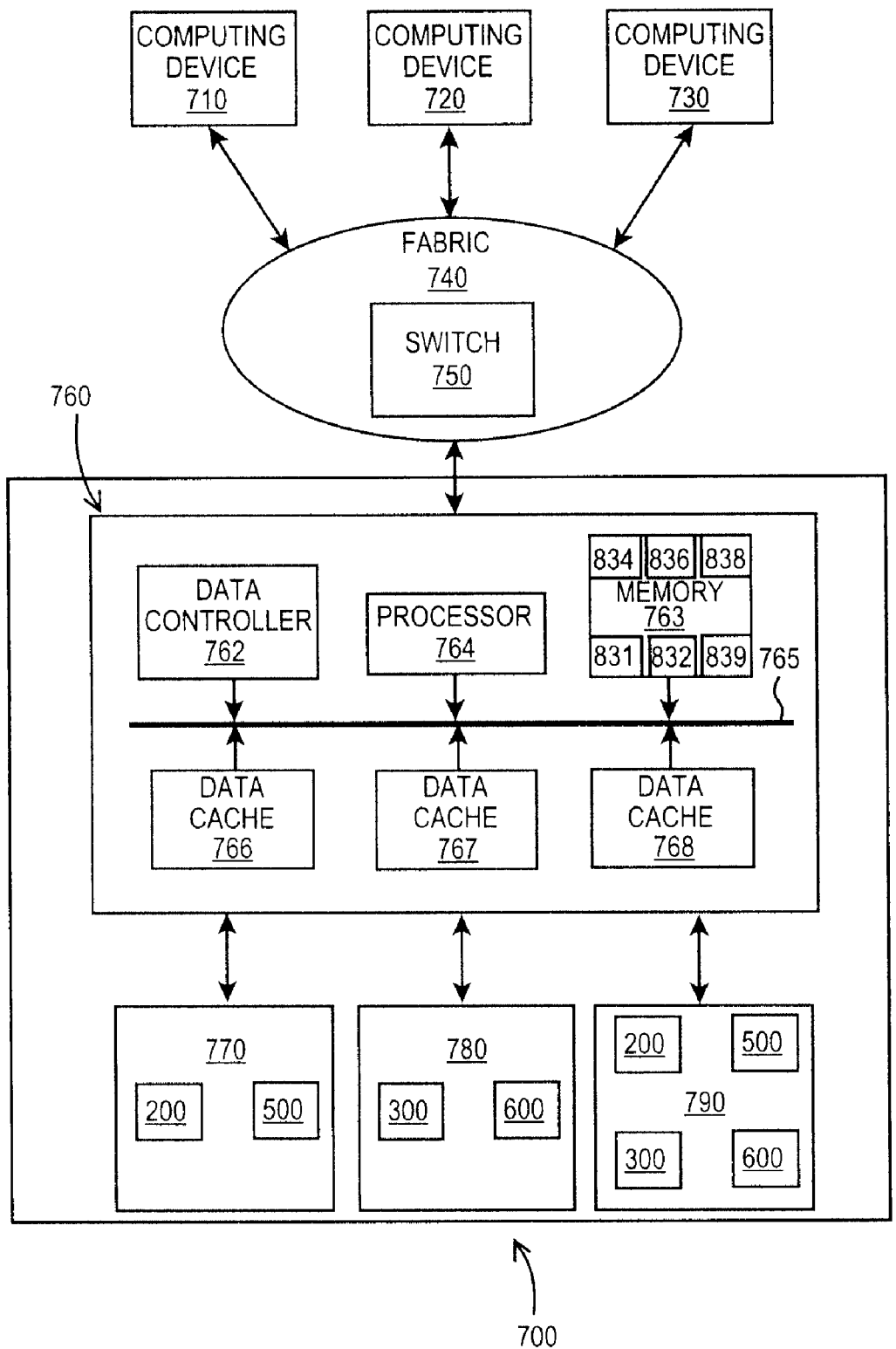
FIG. 7 is a block diagram showing one embodiment of Applicants' holographic data storage system.

In the illustrated embodiment of FIG. 2, SLM 210 displays image 220, wherein image 220 comprises an orientation image 230 and a data image 240. In certain embodiments of Applicants' apparatus and method, SLM 210 forms data image 240 from information supplied by a data controller external to SLM 210, such as for example and without limitation data controller 762 (FIG. 7). In certain embodiments, SLM 210 recalls a reference orientation image 230 from memory, and displays that reference orientation image in combination with data image 240.

Reference beam 130 is reflected by the mirror 180 to produce reflected reference beam 190. Reflected reference beam 190 interferes with the data beam 260 to form hologram 270, wherein hologram 270 comprises a data portion and an orientation image portion. Hologram 170 is encoded into holographic storage medium 195.

Figure 3A:
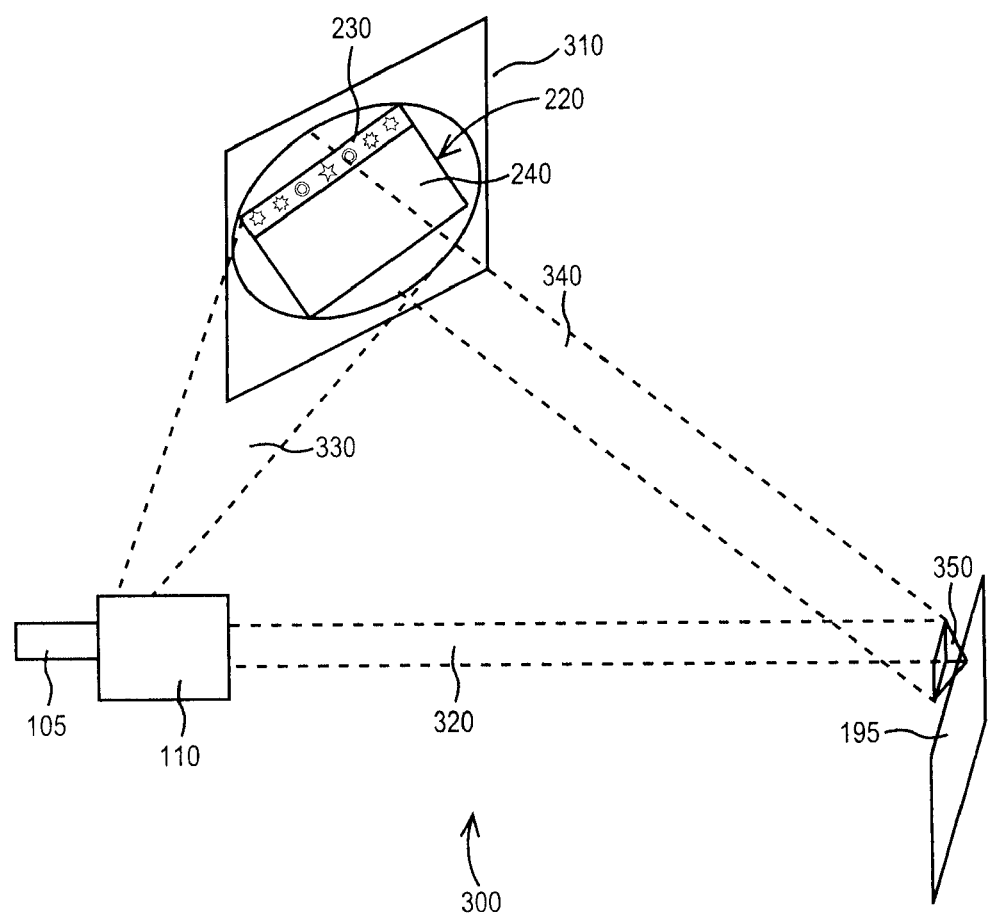
FIG. 3A is a perspective view of a second embodiment of Applicants' holographic information recording apparatus and method.
Figure 3B:
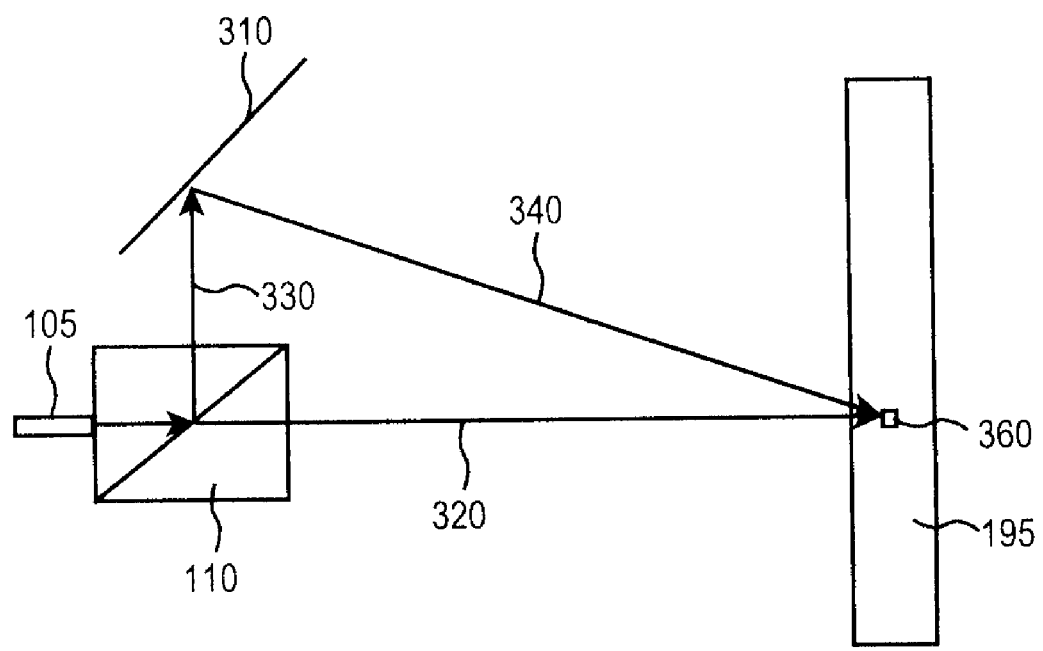
FIG. 3B is a top view of the apparatus of FIG. 3A.

Referring now to FIGS. 3A and 3B, holographic information recording apparatus 300 comprises laser light source 105, beam splitter 110, reflective spatial light modulator 310, and holographic storage medium 195. The light generated by source 105 is split by beam splitter 110 into reference beam 320, and data carrier beam 330. Using Apparatus 300, reference beam 320 is not reflected.

In the illustrated embodiment of FIG. 3, reflective spatial light modulator ("RSLM") 310 displays data image 220, wherein that data image 220 comprises orientation image 230 and data image 240. In certain embodiments, reflective spatial light modulator 310 comprises an assembly comprising a plurality of micro mirrors. In other embodiments, reflective spatial light modulator 310 comprises a liquid crystal on silicon ("LCOS") display device. In contrast to nematic twisted liquid crystals used in LCDs, in which the crystals and electrodes are sandwiched between polarized glass plates, LCOS devices have the liquid crystals coated over the surface of a silicon chip. The electronic circuits that drive the formation of the image are etched into the chip, which is coated with a reflective (aluminized) surface. The polarizers are located in the light path both before and after the light bounces off the chip. LCOS devices are easier to manufacture than conventional LCD displays. LCOS devices have higher resolution because several million pixels can be etched onto one chip. LCOS devices can be much smaller than conventional LCD displays.

Carrier beam 330 picks up image 220 as the light is reflected off reflective spatial light modulator 310 to form reflected data beam 340 comprising image 220. Unreflected reference beam 320 interferes with reflected data beam 340 to form hologram 350, wherein hologram 350 comprises an orientation image portion and a data image portion. Hologram 350 is formed within storage medium 195 thereby causing the photo-active storage medium to create interference pattern 360 (FIG. 3B) comprising encoded hologram 350.

When encoding multiple holograms wherein each hologram comprises a portion of information provided to the holographic data storage system, Applicants' method displays a first plurality of images on an SLM, transmissive or reflective, and encodes that first plurality of images in a holographic data storage medium, wherein each of those encoded images comprises a different data image in combination with the same orientation image. For storage redundancy purposes, Applicants' method may encode within the same holographic data storage medium but at different storage locations, or within a different holographic data storage medium, a second plurality of images, wherein that second plurality of images duplicates the first plurality of images.

Figure 4:
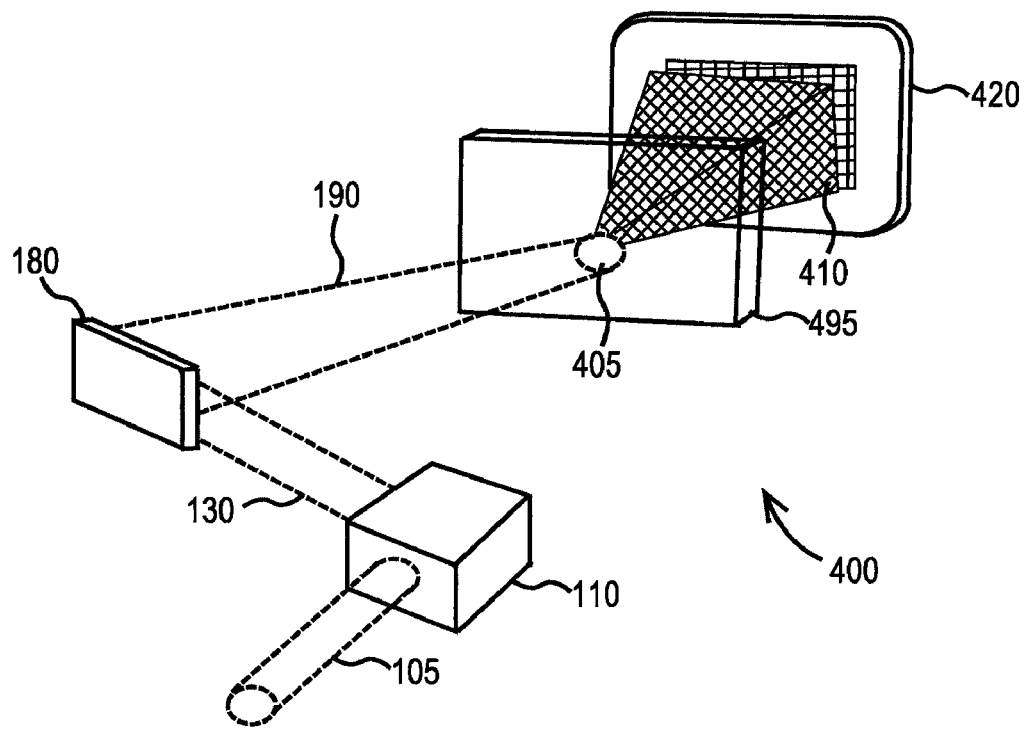
FIG. 4 is a holographic information reading apparatus and method.

FIG. 4 illustrates prior holographic information reading apparatus 400. Apparatus 400 comprises laser light source 105, beam splitter 110, encoded holographic storage medium 495, and optical sensor 420. Optical sensor 420 is disposed a distance away from the holographic storage medium 195 sufficient to accurately capture the image 410 projected upon it. To read the hologram, reference beam 130 is reflected off of mirror 180, to become reflected reference beam 190, which is then incident on the holographic storage medium 495. As the reference beam 190 interferes with the encoded hologram 405 stored on the storage medium 195, an image 410 resembling the original image 150 (FIG. 1) displayed by the SLM 140 (FIG. 1) is projected against the optical sensor 420. The optical sensor 420 then captures the information comprising image 410.

Figure 5:
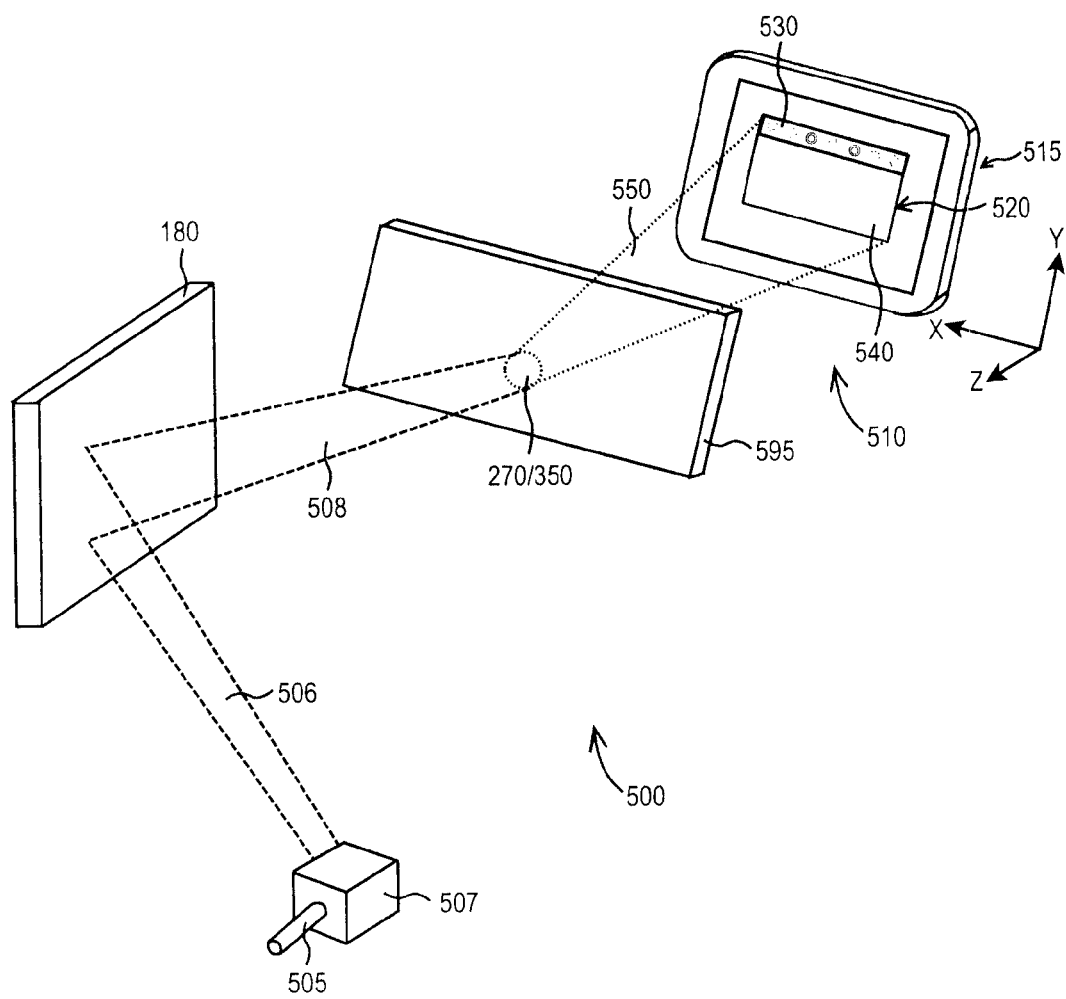
FIG. 5 is a perspective view of a first embodiment of Applicants' holographic information reading apparatus and method.

FIG. 5 illustrates holographic information reading apparatus 500. Apparatus 500 comprises laser light source 505, beam splitter 507, encoded holographic storage medium 595, and optical sensor 510 (FIGS. 5, 6, 8, 9). Optical sensor 510 (FIGS. 5, 6, 8, 9) is disposed a distance away from encoded holographic storage medium 595 sufficient to accurately capture the image 520 projected upon it. To read encoded hologram 270 (FIG. 2) or encoded hologram 350 (FIG. 3), reference beam 506 is reflected off of mirror 180, to form reflected reference beam 508, which is then incident on the encoded holographic storage medium 595. As the reference beam 508 interferes with hologram 270 (FIG. 2)/350 (FIG. 3) encoded in the storage medium 595, a reconstructed data beam 550 is generated, wherein that reconstructed data beam 550 comprises an image 520 resembling the original image 220 (FIGS. 2, 3) is projected onto input screen portion 515 of optical sensor 510 (FIGS. 5, 6, 8, 9), wherein image 520 comprises an orientation image portion 530 and a data image portion 540. The optical sensor 510 (FIGS. 5, 6, 8, 9) then captures the information comprising image 520.

Figure 8A:
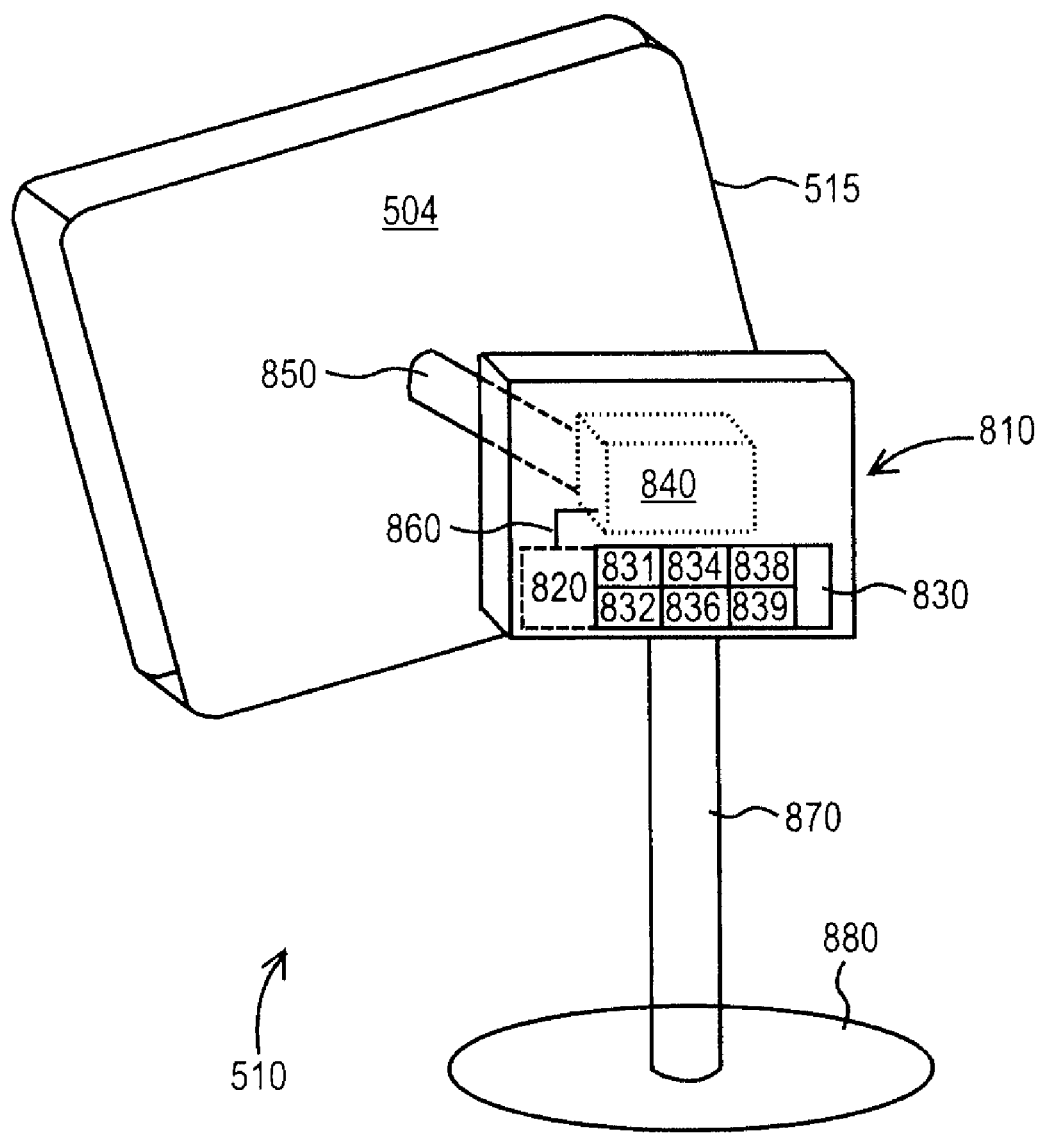
FIG. 8A is a perspective view of a portion of one embodiment of Applicants' optical detector.
Figure 8B:
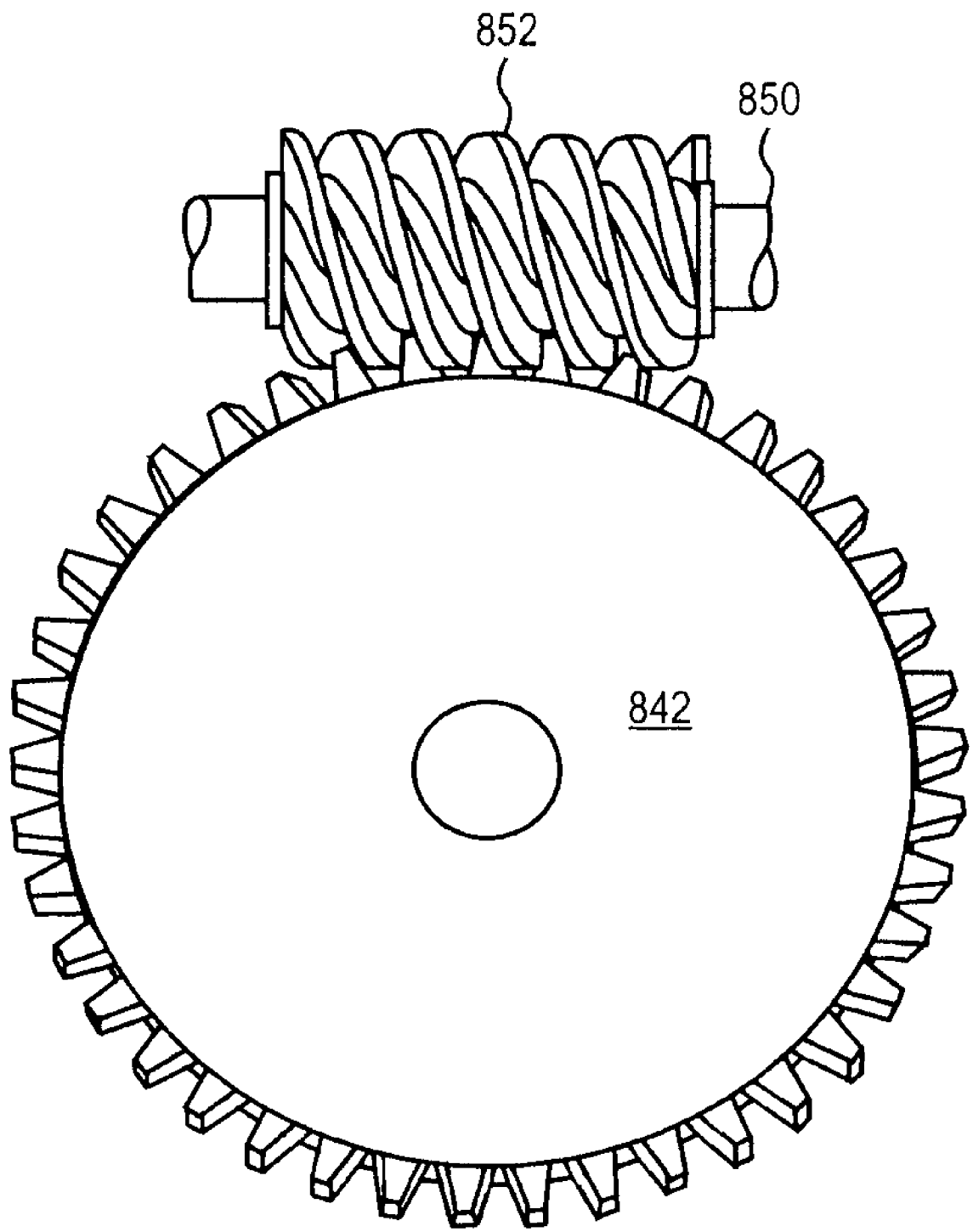
FIG. 8B is a side view of a worm gear drive disposed in certain embodiments within Applicants' optical detector.
Figure 9:
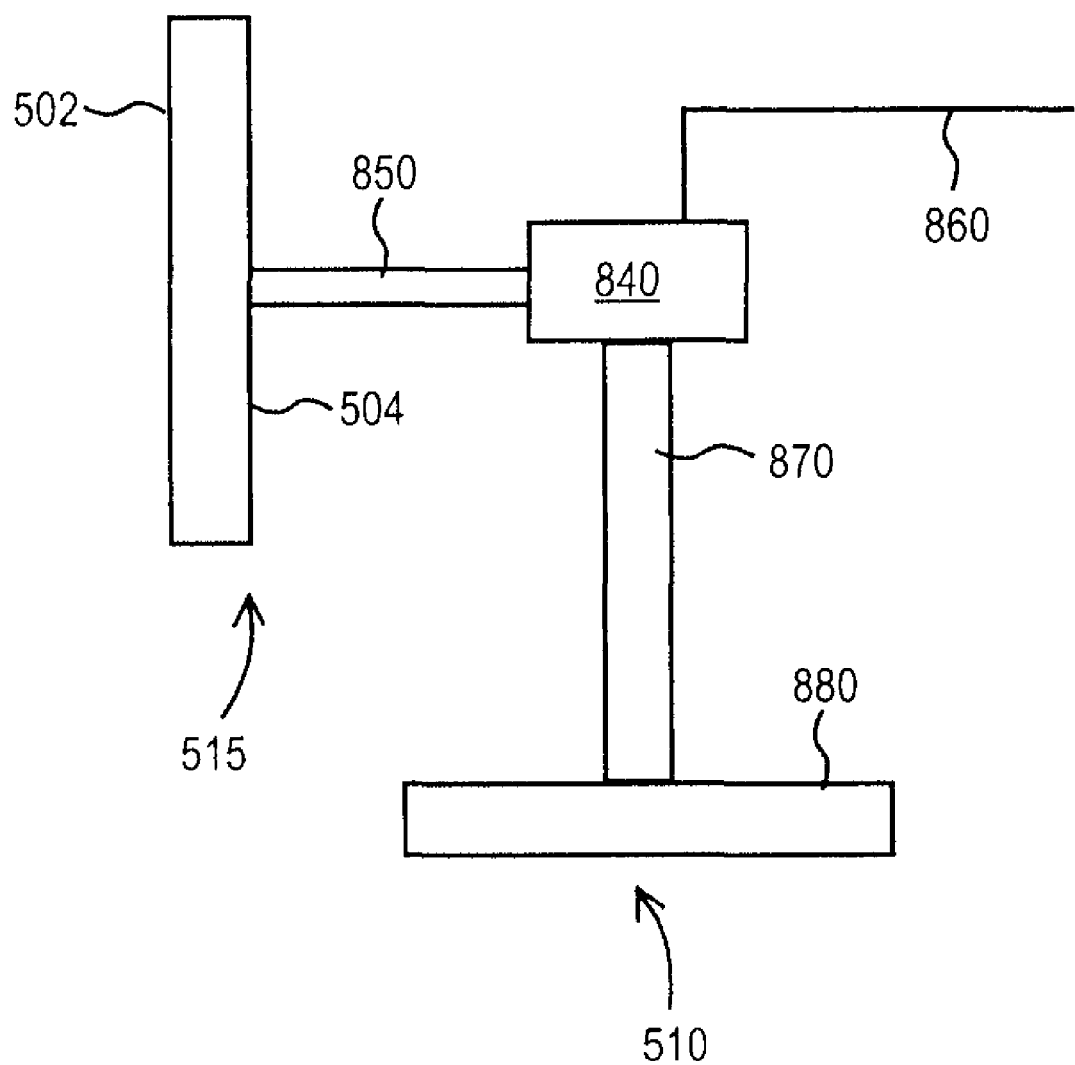
FIG. 9 is a side view of a second embodiment of Applicants' optical detector.

Referring now to FIGS. 8 and 9, optical sensor 510 (FIGS. 5, 6, 8, 9) further comprises rotation-error-servo ("RES") 840. As those skilled in the art will appreciate, a servo comprises a device comprising an external shaft, such as rotatable shaft 850. Referring now to FIG. 8B, in certain embodiments RES 840 comprises a rotatable worm wheel 842, and shaft 850 comprises a spirally-threaded portion 852, wherein spiral-threaded portion 852 meshes with worm wheel 842.

Rotatable shaft 850 can be positioned to a specific angular positions by sending RES 840 a pre-defined coded signal. As long as that coded signal exists on input line 860, RES 840 will maintain the associated angular position of shaft 850. As the coded signal changes, the angular position of the shaft 850 changes.

In the illustrated embodiment of FIGS. 8 and 9, RES 840 is interconnected to rear portion 504 of input screen 515 (FIGS. 5, 6, 8, 9) by rotatable shaft 850. RES 840 can cause input screen 515 (FIGS. 5, 6, 8, 9) to rotate in a first direction, i.e. clockwise, or to rotate in a second and opposite direction, i.e. counter-clockwise, by causing rotatable shaft 850 to rotate in the first direction or in the second direction, respectively. In certain embodiments, optical detector 510 further comprises a floor stand 880 and vertical pillar 870.

In the illustrated embodiment of FIG. 8, optical detector 510 further comprises detector controller 810, wherein RES 840 is disposed within detector controller 810. In the illustrated embodiment of FIG. 8, detector controller 810 further comprises processor 820 and memory 830. In certain embodiments, memory 830 comprises non-volatile memory, such as and without limitation, battery backed-up RAM; a magnetic disk in combination with the associated software, firmware, and hardware, to read information from, and write information to, that magnetic disk; an optical disk in combination with the associated software, firmware, and hardware, to read information from, and write information to, that optical disk; an electronic storage medium; and the like. By "electronic storage medium," Applicants mean, for example, a device such as a PROM, EPROM, EEPROM, Flash PROM, compactflash, smartmedia, and the like.

In the illustrated embodiment of FIG. 8, detector controller 810 further comprises reference orientation image 831, microcode 832, first partial matched filter 834, second partial matched filter 836, third partial matched filter 838, and threshold correlation factor 839, wherein reference orientation image 831, microcode 832, first partial matched filter 834, second partial matched filter 836, third partial matched filter 838, and threshold correlation factor 839 are written to memory 830. Processor 820 utilizes microcode 832 to operate optical detector 510.

In the illustrated embodiment of FIG. 9, signal input line 860 interconnects RES 840 with an external controller, such as storage controller 760 (FIG. 7).

Figure 6:
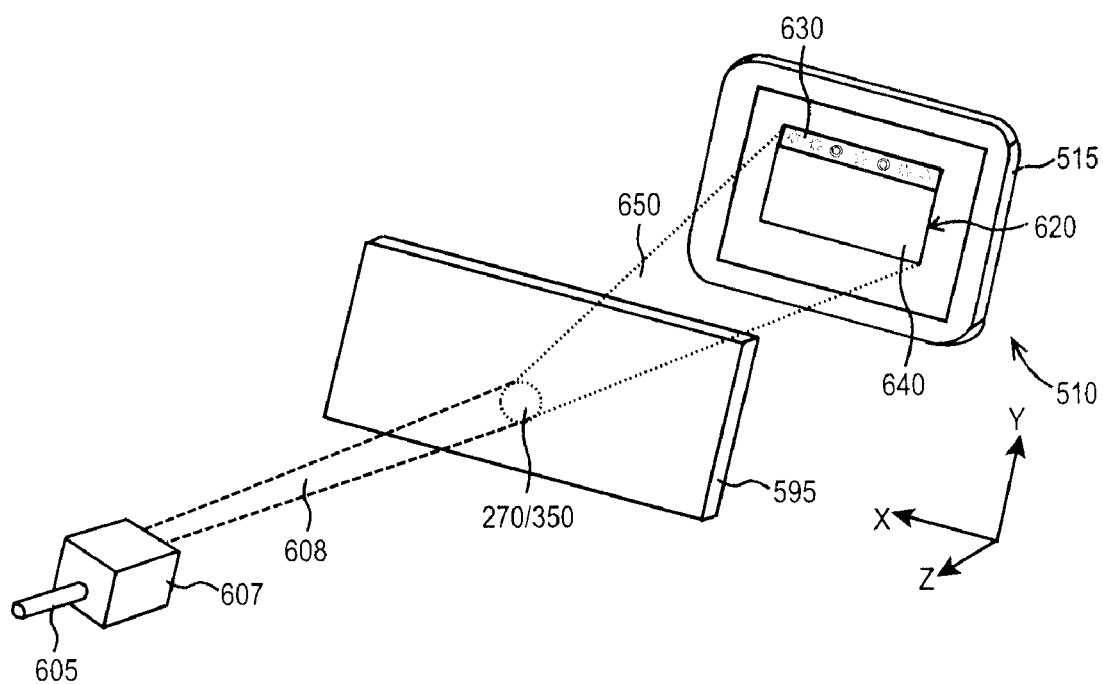
FIG. 6 is a perspective view of a second embodiment of Applicants' holographic information reading apparatus and method.

FIG. 6 shows holographic information reading apparatus 600. Apparatus 600 comprises laser light source 605, optional beam splitter 607, encoded holographic data storage medium 595, and optical sensor 510 (FIGS. 5, 6, 8, 9). Light source 605 and optional beam splitter 607 provide reference beam 608.

Reference beam 608 is directed toward holographic storage medium 595 such that reference beam 608 is diffracted by the encoded hologram 270 (FIG. 2)/350 (FIG. 3) to form reconstructed data beam 650 comprising image 620 which resembles the original image 220 (FIGS. 2, 3), wherein image 620 comprises an orientation image portion 630 and a data image portion 640. Image 620 is projected onto input screen 515 (FIGS. 5, 6, 8, 9) of optical sensor 510 (FIGS. 5, 6, 8, 9). Optical sensor 510 (FIGS. 5, 6, 8, 9) then captures the information comprising image 620.

In the illustrated embodiment of FIG. 6, holographic information reading apparatus 600 comprises beam splitter 110. In other embodiments, holographic information reading apparatus 600 does not comprise a beam splitter. In these embodiments, laser light source 605 provides reference beam 608, which is directed without reflection toward encoded holographic storage medium 595 such that reference beam 608 is diffracted by encoded hologram 270 (FIG. 2)/350 (FIG. 3) to form image 620 resembling the original image 220 (FIGS. 2, 3), wherein image 620 comprises an orientation image portion 630 and a data image portion 640. Image 620 is projected onto input screen 515 (FIGS. 5, 6, 8, 9) of optical sensor 510 (FIGS. 5, 6, 8, 9). Optical sensor 510 (FIGS. 5, 6, 8, 9) then captures the information comprising image 620.

FIG. 7 illustrates one embodiment of Applicants' holographic data storage and retrieval system 700. In the illustrated embodiment of FIG. 7, holographic data storage and retrieval system 700 communicates with computing devices 710, 720, and 730. In the illustrated embodiment of FIG. 7, computing devices 710, 720, and 730 communicate with storage controller 760 through a data communication fabric 740. In certain embodiments, fabric 740 comprises one or more data switches 750. Further in the illustrated embodiment of FIG. 7, storage controller 760 communicates with one or more holographic encoding/decoding systems. In the illustrated embodiment of FIG. 7, holographic data storage and retrieval system 700 comprises holographic encoding/decoding systems 770, 780, and 790, wherein each of those holographic encoding/decoding systems comprises at least one holographic information encoding apparatus, such as and without limitation apparatus 200 and/or apparatus 300, in combination with at least one holographic information decoding apparatus, such as and without limitation apparatus 500 and/or apparatus 600.

In certain embodiments, computing devices 710, 720, and 730, are selected from the group consisting of an application server, a web server, a work station, a host computer, or other like device from which information is likely to originate. In certain embodiments, one or more of computing devices 710, 720, and/or 730 are interconnected with fabric 640 using Small Computer Systems Interface ("SCSI") protocol running over a Fibre Channel ("FC") physical layer. In other embodiments, the connections between computing devices 710, 720, and 730, comprise other protocols, such as Infiniband, Ethernet, or Internet SCSI ("iSCSI"). In certain embodiments, switches 750 are configured to route traffic from the computing devices 710, 720, and/or 730, directly to the storage controller 760.

In the illustrated embodiment of FIG. 7, storage controller 760 comprises a data controller 762, memory 763, processor 764, and data caches 766, 767, and 768, wherein these components communicate through a data bus 765. In certain embodiments, memory 763 comprises a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

In certain embodiments, the storage controller 760 is configured to read data signals from and write data signals to a serial data bus on one or more of the computing devices 710, 720, and/or 730. Alternatively, in other embodiments the storage controller 760 is configured to read data signals from and write data signals to one or more of the computing devices 710, 720, and/or 730, through the data bus 765 and the fabric 740.

In certain embodiments, storage controller 760 converts a serial data stream into a convolution encoded data images. Those data images are transferred to an SLM 210 (FIG. 2) or a RSLM 310 (FIGS. 3A, 3B) disposed in one or more of holographic encoding/decoding systems 770, 780, and/or 690.

In certain embodiments, holographic encoding/decoding systems 770, 780, and 790, are located in different geographical places. In certain embodiments, storage controller 760 distributes information between two or more holographic encoding/decoding systems in order to protect the information.

Applicants' invention comprises an apparatus method to encode one or more holograms in a holographic data storage medium, wherein each hologram may comprise a different data image, but wherein each of the holograms comprises the same orientation image. Applicants' invention further comprises an apparatus and method to read one or more holograms encoded in a holographic data storage medium, wherein each of those one or more holograms may comprise a different data image, but wherein each hologram comprises the same orientation image. Applicants' invention further comprises a method to compare a projected orientation image with a reference orientation image, and to reposition the optical detector to increase the correlation of, i.e. the overlap, of the projected orientation image with the reference orientation image.

Figure 10:
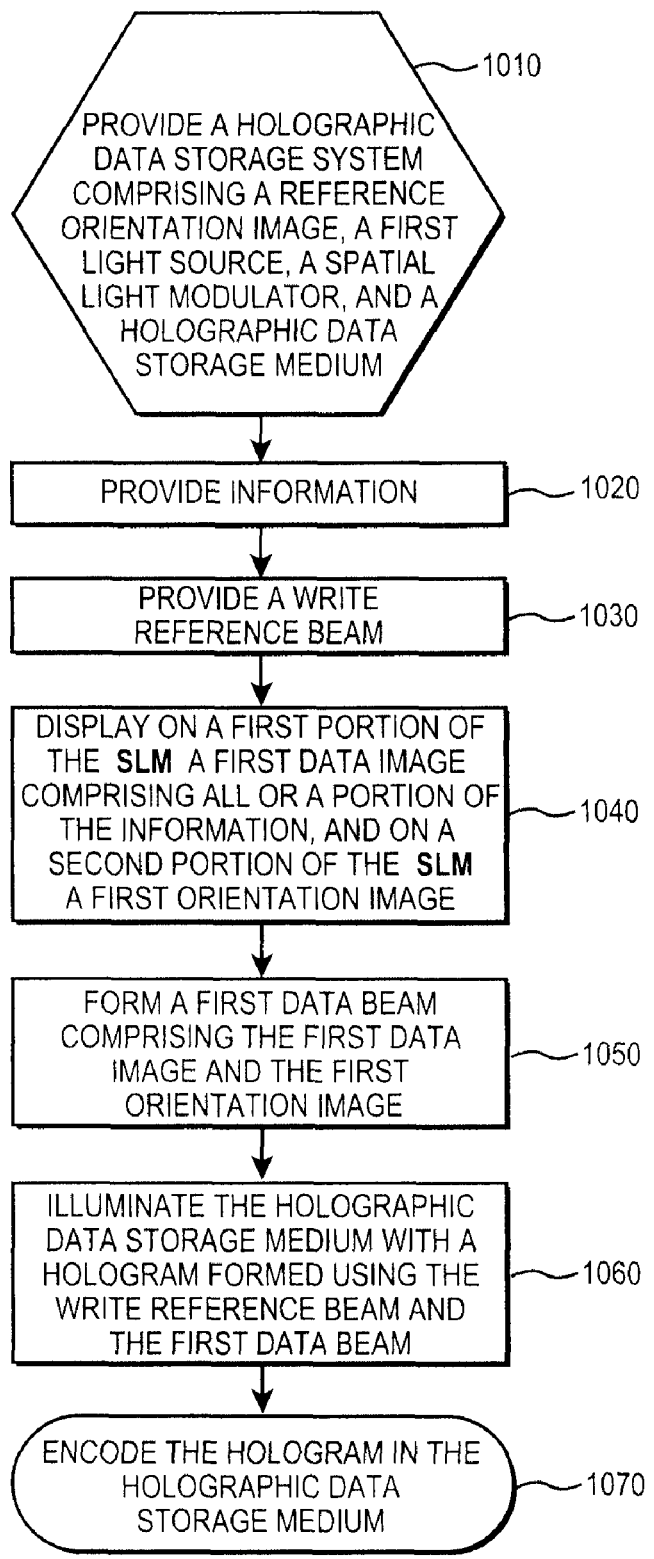
FIG. 10 is a flow chart summarizing the steps of Applicants' method to encode data in a holographic data storage medium.

FIG. 10 summarizes the steps of Applicants' method to encode information in a holographic data storage medium. Referring now to FIG. 10, in step 1010 Applicants' method provides a holographic information recording system, such as for example and without limitation system 200 (FIG. 2) or system 300 (FIG. 300), comprising a reference orientation image, a first light source, a spatial light modulator ("SLM"), and a holographic data storage medium. In certain embodiments, the SLM of step 1010 comprises a transmissive SLM, such as SLM 210 (FIG. 2). In certain embodiments, the SLM comprises a reflective SLM, such as reflective SLM 310 (FIG. 3). In certain embodiments, the holographic information recording system of step 1010 may be disposed in a holographic data storage system, such as and without limitation holographic data storage system 700 (FIG. 7).

In step 1020, Applicants' method provides information to the holographic information recording system of step 1010. In certain embodiments, the information of step 1020 comprises digital data. In certain embodiments, the information of step 1020 comprises analog data. In certain embodiments, the information of step 1020 comprises both digital data and analog data. In certain embodiments, the information of step 1020 is provided by one or more computing devices, such as without limitation, one or more of computing devices 710 (FIG. 7), 720 (FIG. 7), and/or 730 (FIG. 7). In certain embodiments, one or more of computing devices 710, 720, and/or 730, comprises a host computer.

In step 1030, the method provides a write reference beam, such as and without limitation reference beam 190 (FIG. 2) or reference beam 320 (FIG. 3). In step 1040, Applicants' method displays on a first portion of the SLM of step 1010 a first data image, such as first data image 240 (FIG. 2, 3), comprising all or a portion of the information of step 1020. In step 1040, Applicants' method further synchronously displays on a second portion of the SLM a first orientation image, such as and without limitation orientation image 230 (FIGS. 2, 3).

In step 1050, Applicants' method forms a first data beam comprising the first data image of step 1040 and the first orientation image of step 1040. In certain embodiments, step 1050 further comprises providing a first light source, such as light source 110 (FIGS. 1, 2, 3), emitting a carrier beam, such as carrier beam 120 (FIGS. 1, 2), from the first light source, and passing that carrier beam through a transmissive SLM displaying the first data image and the first orientation image. In certain embodiments, step 1050 further comprises providing a light source, such as light source 110 (FIGS. 1, 2, 3) emitting a carrier beam, such as carrier beam 330 (FIG. 3), and reflecting that carrier beam off a reflective SLM displaying the first data image and the first orientation image.

In step 1060, Applicants' method illuminates a holographic data storage medium, such as holographic data storage medium 195 (FIGS. 1, 2, 3), with a hologram formed using the write reference beam of step 1030 and the first data beam of step 1050, wherein that hologram comprises a data image and an orientation image. In step 1070, Applicants' method encodes the hologram of step 1060 in the holographic data storage medium to form an encoded holographic data storage medium, such as encoded holographic data storage medium 595 (FIG. 5, 6), wherein each of the encoded holograms may comprise a different data image, and wherein each of the encoded holograms comprises the same orientation image. In certain embodiments, step 1070 comprises encoding in the holographic data storage medium an interference pattern formed using the write reference beam of step 1030 and the first data beam of step 1050.

Figure 11:
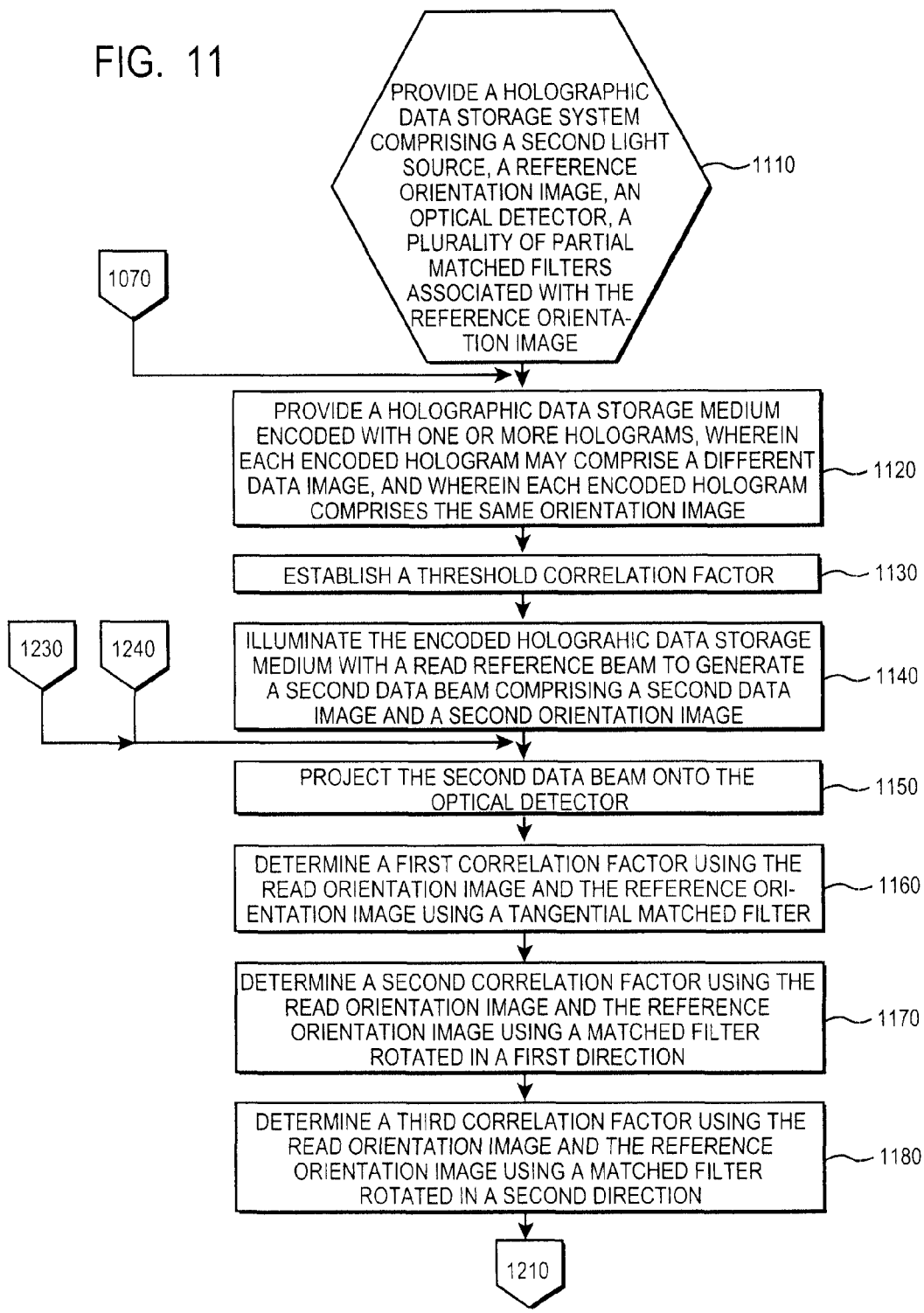
FIG. 11 is a flow chart summarizing the initial steps of Applicants' method to read information encoded in a holographic data storage medium.
Figure 12:
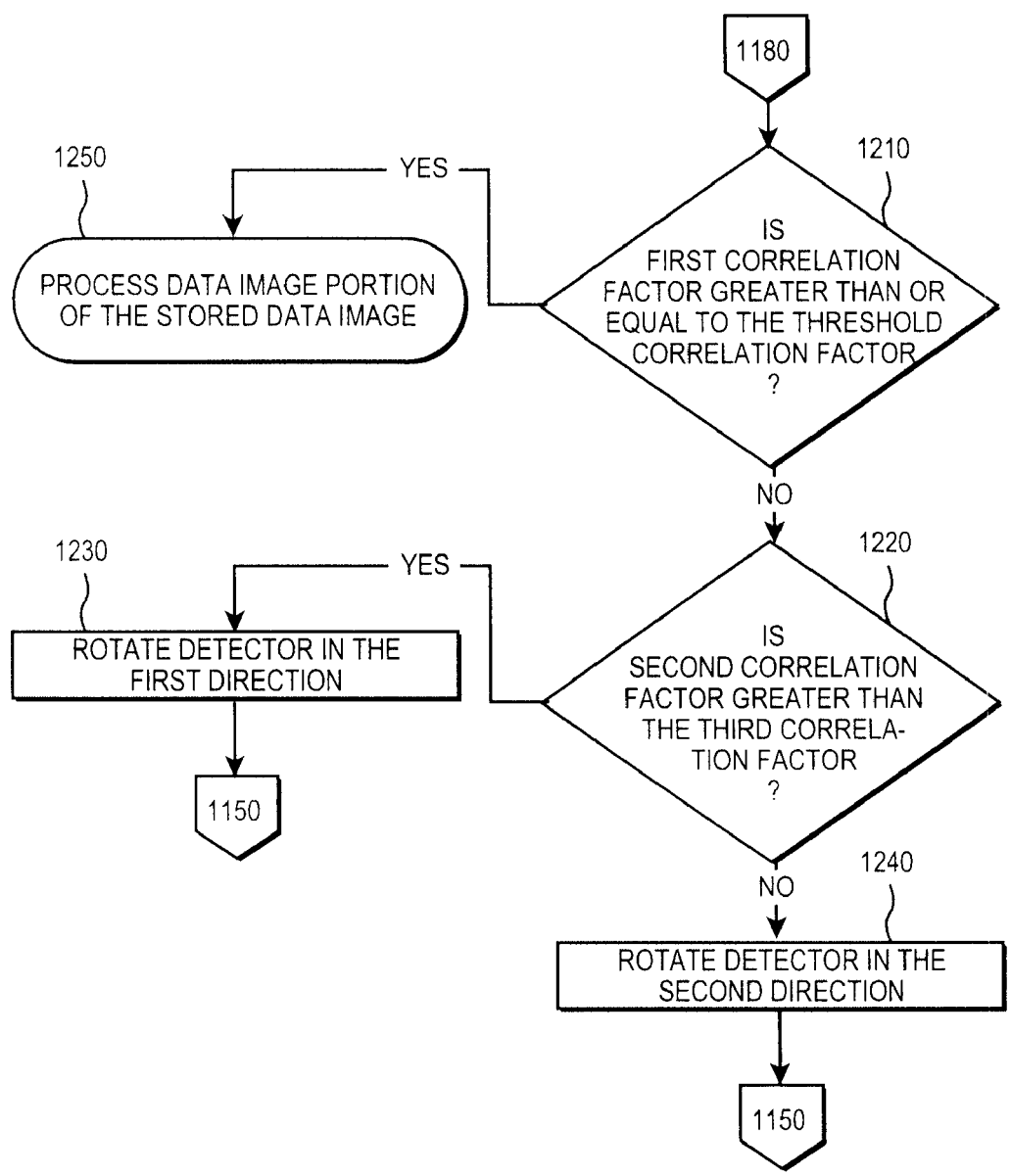
FIG. 12 is a flow chart summarizing additional steps of Applicants' method to read information encoded in a holographic data storage medium.

FIGS. 11 and 12 summarize the steps of Applicants' method to read one or more holograms from a holographic data storage medium, wherein each of those one or more holograms may comprise a different data image and, and wherein each of those one or more holograms comprises the same orientation image, and to compare with a projected orientation image with a reference orientation image, and to reposition the optical detector to increase the correlation of, i.e. the overlap, of the projected orientation image with the reference orientation image.

In step 1110, Applicants' method provides a holographic information reading system, such as and without limitation, holographic information reading system 500 (FIG. 5) or holographic information reading system 600 (FIG. 6), comprising a second light source, such as light source 505 (FIG. 5) or 605 (FIG. 6), a reference orientation image, such as reference orientation image 831 (FIGS. 7, 8), a plurality of partial matched filters, such as partial matched filters 834 (FIGS. 7, 8) 836, (FIGS. 7, 8) and 838 (FIGS. 7, 8), an encoded holographic data storage medium, such as encoded data storage medium 595 (FIGS. 5, 6), and an optical detector, such as optical detector 510 (FIGS. 5, 6). In certain embodiments, the holographic information reading system of step 1110 may be disposed in a holographic data storage system, such as and without limitation holographic data storage system 700 (FIG. 7).

In certain embodiments, the second light source of step 1110 is the same as the first light source of step 1010. In these embodiments, the apparatus used to encode images in the holographic data storage medium is subsequently used to read those holograms. In other embodiments, the second light source of step 1110 differs from the first light source of step 1010. In these embodiments, Applicants' method to read information encoded to a holographic data storage medium comprises an error recovery process, wherein the apparatus used to encode a holographic data storage medium is for some reason unavailable, and a different apparatus must be used to read information encoded in the holographic data storage medium.

In certain embodiments, the optical detector of step 1110 comprises a rotation-error-servo ("RES"), such as RES 840 (FIGS. 8, 9), where that RES comprises a rotatable shaft, such as rotatable shaft 850 (FIG. 8), extending outwardly therefrom, wherein that rotatable shaft is attached to the rear portion, such as rear portion 504, of the optical detector, such as optical detector 510.

In step 1120, Applicants' method provides an encoded holographic data storage medium, such as encoded holographic data storage medium 595 (FIGS. 5, 6), wherein each hologram encoded therein may comprise a different data storage image, and wherein each hologram encoded therein comprises the same orientation image.

In step 1130, Applicants' method establishes a threshold correlation factor. In certain embodiments, the threshold correlation factor of step 1130 is set by the owner and/or operator of the holographic information reading system of step 1110. In certain embodiments, the threshold correlation factor of step 1130 is set by one or more computing systems, such as one or more of computing systems 710 (FIG. 7), 720 (FIG. 7), and/or 730 (FIG. 7).

In certain embodiments, the threshold correlation factor of step 1130 is written to memory 763 (FIG. 7) as threshold correlation factor 839 (FIGS. 7, 8). In certain embodiments, the threshold correlation factor is written to memory 830 (FIG. 8) as threshold correlation factor 839 (FIGS. 8, 9).

In step 1140, Applicants' method illuminates the encoded holographic data storage medium of step 1110 with a read reference beam, provided by the second light source of step 1110, to generate a second data beam, such as data beam 550 (FIG. 5) or data beam 650 (FIG. 6), wherein that second data beam comprises a second data image in combination with a second orientation image, such as and without limitation second data image 540 (FIG. 5) in combination with second orientation image 530 (FIG. 5), or second data image 640 (FIG. 6) in combination with second orientation image 630 (FIG. 6).

In step 1150, the second data beam of step 1140 is projected onto the optical detector of step 1110, such as optical detector 510 (FIGS. 5, 6, 8, 9), such that a second image, such as image 520 (FIG. 5) or second image 620 (FIG. 6), resembling the original data image, such as image 220 (FIGS. 2, 3), is disposed on the input screen portion of the optical detector, such as input screen 515 (FIGS. 5, 6, 8, 9) of optical sensor 510 (FIGS. 5, 6, 8, 9), wherein that second image comprises an orientation image in combination with a data image.

Figure 13:
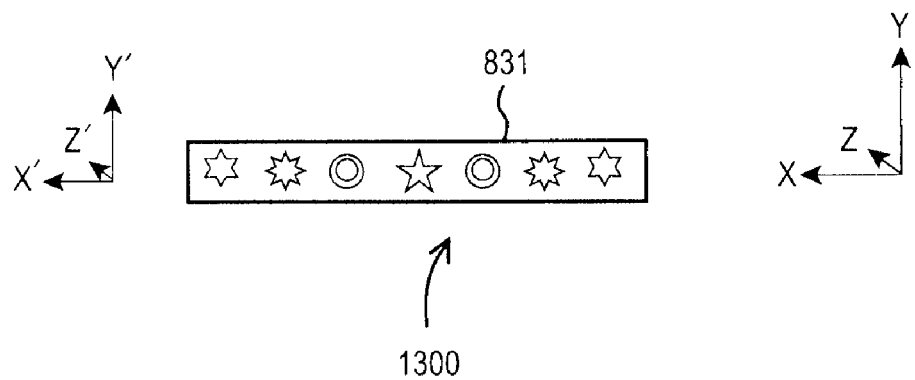
FIG. 13 shows one embodiment of Applicants' reference orientation image as seen through a tangential partial matched filter.

In step 1160, Applicants' method determines a first correlation factor between the orientation image projected onto the optical detector in step 1150, and the reference orientation image of step 1110 as seen through a tangential partial matched filter, such as for example first partial matched filter 834 (FIGS. 7, 8). Referring now to FIG. 13, image 1300 comprises reference orientation image 831 as seen through Applicants' tangential partial matched filter, wherein the X' axis of image is 1300 parallel to the X axis of the optical detector, and wherein the Y' axis of image 1300 is parallel to the Y axis of the optical detector, and wherein the Z' axis of image 1300 is parallel to the Z axis of the optical detector.

In certain embodiments, step 1160 is performed by a processor, such as processor 820 (FIG. 8), disposed within Applicants' optical detector 510 (FIGS. 5, 6). In certain embodiments, step 1160 is performed by a processor, such as processor 764 (FIG. 7), disposed within Applicants' storage controller 760 (FIG. 7).

In certain embodiments, in step 1160 Applicants' method calculates the difference between the projected orientation image g(x,y) the impulse response h(x,y)=s*(−x,−y) of the image 1300 (FIG. 13). Referring now to Equation (1), V(x,y) for step 1160 comprises the cross-correlation between the projected orientation image and image 1300 s(x,y). As those skilled in the art will appreciate, Equation (1) comprises a double integral, meaning that the integration is over the X axis and Y axis directions of the input screen portion of the optical detector. Additionally, ξ is the integration variable along that X axis, η is the integration variable along that Y axis, and * denotes a complex conjugate.

$$V(x,y)=\iint g(\xi,\eta)s^*(\xi-x,\eta-y)d\xi d\eta \qquad (1)$$

Mathematically, V(x,y) comprises a surface varying along the X axis and the Y axis, for each (x,y). There is one value of V(x,y) for each detector element in detector 510. In certain embodiments, the range V(x,y) for each (x,y) is between −1 and +1, wherein +1 represents the ideal correlation of one hundred (100%). To maximize V(x,y), the following difference surface, Difference (x,y), is defined in Equation (2).

$$\text{Difference}(x,y)=1-V(x,y) \qquad (2)$$

Difference(x,y) is calculated by subtracting the partial matched filter correlation V(x,y) from unity. In certain embodiments, Difference(x,y) is evaluated (a) point-to-point. In certain embodiments, Difference(x,y) is evaluated as an arithmetic mean. In certain embodiments, Difference(x,y) is evaluated as a geometric mean. In certain embodiments, Difference(x,y) is evaluated as a root-mean-square. In certain embodiments, Difference(x,y) ranges between 0 and +2, wherein the ideal difference for each value of (x,y) is 0, meaning for a value of 0 that there is no difference between the projected orientation image and the reference orientation image at that point (x,y).

In certain embodiments, Difference(x,y) is evaluated point-by-point. In other embodiments, Applicants have found it advantageous to quantify surface Difference(x,y) in terms of a single number, i.e. a correlation factor. In certain embodiments, the first correlation factor of step 1160, and/or the second correlation factor of step 1170, and/or the third correlation factor of step 1180, comprises a MAX_Difference which is equal to the maximum value of Difference(x,y). In certain embodiments, the first correlation factor of step 1160, and/or the second correlation factor of step 1170, and/or the third correlation factor of step 1180 comprises an AM_Difference comprising the arithmetic mean of the values of Difference(x,y). In still other embodiments, the first correlation factor of step 1160, and/or the second correlation factor of step 1170, and/or the third correlation factor of step 1180, comprises a GM_Difference comprising the geometric mean of the values of Difference(x,y). In yet other embodiments, the first correlation factor of step 1160, and/or the second correction factor of step 1170, and/or the third correlation factor of step 1180, comprises an RMS_Difference comprising the root-mean-square of the values of Difference(x,y).

Figure 14:
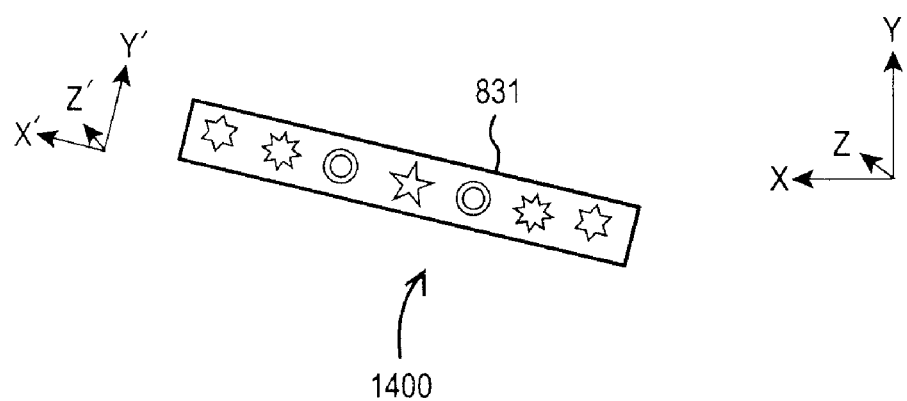
FIG. 14 shows Applicants' reference orientation image as seen through a first rotated partial matched filter.

In step 1170, Applicants' method determines a second correlation factor between the orientation image projected onto the optical detector in step 1150, and the reference orientation image 831 as seen through a first rotated partial matched filter. Referring now to FIG. 14, image 1400 comprises reference image 831 as seen through Applicants' first rotated partial matched filter, wherein neither the X' axis nor the Y' axis of image 1400 is parallel to the X axis of the optical detector, but wherein the Z' axis of image 1400 is parallel to the Z axis of the optical detector.

The X' axis of image 1400 is rotated in a first direction from the X axis of optical detector about the Z axis. In certain embodiments, the X' axis of image 1400 is rotated about the Z axis an increment of about one degree in a first direction from the X axis of optical detector. The second correlation factor is calculated using Equations (1) and (2) as described hereinabove.

In certain embodiments, step 1170 is performed by a processor, such as processor 820 (FIG. 8), disposed within Applicant's optical detector 510 (FIGS. 5, 6). In certain embodiments, step 1170 is performed by a processor, such as processor 764 (FIG. 7), disposed within Applicants' storage controller 760 (FIG. 7).

Figure 15:
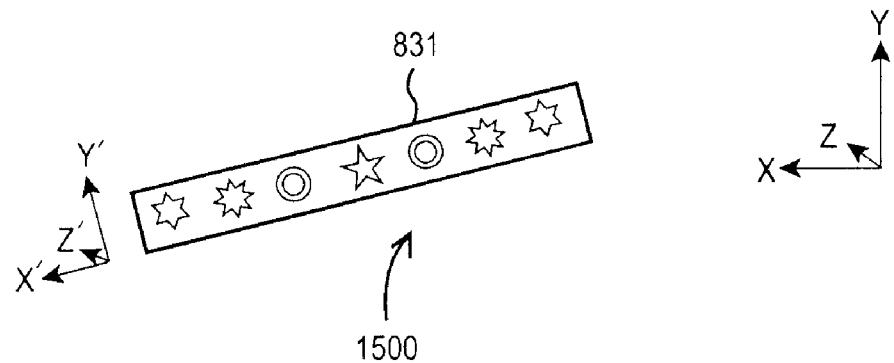
FIG. 15 shows Applicants' reference orientation image as seen through a second rotated partial matched filter.

In step 1180, Applicants' method determines a third correlation factor between the orientation image projected onto the optical detector in step 1150, and the reference orientation image 831 as seen through a second rotated partial matched filter. Referring now to FIG. 15, image 1500 comprises reference image 831 as seen through Applicants' second rotated partial matched filter, wherein neither the X' axis nor the Y' axis of image 1400 is parallel to the X axis of the optical detector, but wherein the Z' axis of image 1500 is parallel to the Z axis of the optical detector.

The X axis of the image 1500 is rotated in a second direction from the X axis of optical detector about the Z axis. In certain embodiments, the X' axis of image 1500 is rotated about the Z axis an increment of about one degree in the second direction from the X axis of optical detector. The third correlation factor is calculated using Equations (1) and (2) as described hereinabove.

In certain embodiments, step 1180 is performed by a processor, such as processor 820 (FIG. 8), disposed within Applicants' optical detector 510 (FIGS. 5, 6). In certain embodiments, step 1180 is performed by a processor, such as processor 764 (FIG. 7), disposed within Applicants' storage controller 760 (FIG. 7).

Applicants' method transitions from step 1180 to step 1210 (FIG. 12). Referring now to FIG. 12, in step 1210 Applicants' method determines if the first correlation factor of step 1160 is greater than or equal to the threshold correlation factor of step 1130. In certain embodiments, step 1210 is performed by a processor, such as processor 820 (FIG. 8), disposed within Applicants' optical detector 510 (FIGS. 5, 6, 8, 9). In certain embodiments, step 1210 is performed by a processor, such as processor 764 (FIG. 7), disposed within Applicants' storage controller 760 (FIG. 7).

If Applicants' method determines in step 1210 that the first correlation factor of step 1160 is greater than or equal to the threshold correlation factor of step 1130, then the method transitions from step 1210 to step 1250 wherein the method processes the data image portion, such as data image 540 (FIG. 5) or 640 (FIG. 6) of the second data beam 550 (FIG. 5) or 650 (FIG. 6), respectively, to capture the information encoded in that projected data image. In certain embodiments, step 1250 is performed by a processor, such as processor 820 (FIG. 8), disposed within Applicants' optical detector 510 (FIGS. 5, 6, 8, 9). In certain embodiments, step 1250 is performed by a processor, such as processor 765 (FIG. 7), disposed within Applicants' storage controller 760 (FIG. 7).

If Applicants' method determines in step 1210 that the first correlation factor of step 1160 is not greater than or equal to the threshold correlation factor of step 1130, then the method transitions from step 1210 to step 1220 wherein the method determines if the second correlation factor of step 1170 is greater than the third correlation factor of step 1180. In certain embodiments, step 1220 is performed by a processor, such as processor 820 (FIG. 8), disposed within Applicants' optical detector 510 (FIGS. 5, 6, 8, 9). In certain embodiments, step 1220 is performed by a processor, such as processor 764 (FIG. 7), disposed within Applicants' storage controller 760 (FIG. 7).

If Applicants' method determines in step 1220 that the second correlation factor of step 1170 is greater than the third correlation factor of step 1180, then the method transitions from step 1220 to step 1230 wherein the method rotates the input screen element of Applicants' optical detector about the Z axis in the first direction. In certain embodiments, Applicants' method rotates the input screen about the Z axis an increment of up to two degrees (2°). Applicants' method transitions from step 1230 to step 1150 and continues as described herein.

In certain embodiments, in step 1230 a processor, such as processor 820 (FIG. 8), disposed within Applicants' optical detector, such as optical detector 510 (FIGS. 5, 6, 8, 9), causes a servo comprising a shaft extending outwardly therefrom and attached to the input screen element of Applicants' optical detector, such as RES 840 (FIG. 8) and rotatable shaft 850 (FIG. 8), disposed in Applicants' optical detector to rotate up to two degrees in the first direction. In certain embodiments, in step 1230 a processor, such as processor 764 (FIG. 7), disposed within Applicants' storage controller, such as storage controller 700 (FIG. 7), causes a servo comprising a shaft extending outwardly therefrom and attached to the input screen element of Applicants' optical detector, such as RES 840 (FIG. 8) and rotatable shaft 850 (FIG. 8), disposed in Applicants' optical detector to rotate up to two degrees in the first direction.

If Applicants' method determines in step 1220 that the second correlation factor of step 1170 is not greater than the third correlation factor of step 1180, then the method transitions from step 1220 to step 1240 wherein the method rotates the input screen element of Applicants' optical detector about the Z axis in the second direction. In certain embodiments, in step 1240 Applicants' method rotates the input screen about the Z axis in the second direction an increment of up to two degrees (2°). Applicants' method transition from step 1240 to step 1150 and continues as described herein.

In certain embodiments, in step 1240 a processor, such as processor 820 (FIG. 8), disposed within Applicants' optical detector, such as optical detector 510 (FIGS. 5, 6, 8, 9), causes a servo comprising a shaft extending outwardly therefrom and attached to the input screen element of Applicants' optical detector, such as RES 840 (FIG. 8) and rotatable shaft 850 (FIG. 8), disposed in Applicants' optical detector to rotate up to two degrees in the second direction. In certain embodiments, in step 1240 a processor, such as processor 764 (FIG. 7), disposed within Applicants' storage controller, such as storage controller 700 (FIG. 7), causes a servo comprising a shaft extending outwardly therefrom and attached to the input screen element of Applicants' optical detector, such as RES 840 (FIG. 8) and rotatable shaft 850 (FIG. 8), disposed in Applicants' optical detector to rotate up to two degrees in the second direction.

In certain embodiments, individual steps recited in FIG. 14 may be combined, eliminated, or reordered.

In certain embodiments, Applicants' invention includes instructions residing memory 830 (FIG. 8), where those instructions are executed by a processor, such as processor 820 (FIG. 8), to perform one or more of steps 1160, 1170, and/or 1180, recited in FIG. 11, and/or one or more to steps 1210, 1220, 1230, 1240, and/or 1250, recited in FIG. 12.

In certain embodiments, Applicants' invention includes instructions residing in any other computer program product, where those instructions are executed by a computer external to, or internal to, holographic data storage system 700, to perform one or more of steps 1160, 1170, and/or 1180, recited in FIG. 11, and/or one or more to steps 1210, 1220, 1230, 1240, and/or 1250, recited in FIG. 12. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to store information using a holographic data storage system, comprising the steps of:
   supplying a holographic data storage system comprising a first light source a holographic data storage medium, a spatial light modulator, a memory, and a first orientation image comprising a plurality of separate geometrical shapes comprising at least four different geometrical shapes;
   providing information to said spatial light modulator;
   recalling by said spatial light modulator said first orientation image from memory;
   generating a write reference beam using said first light source;
   forming a first data beam comprising a first data image and said first orientation image;
   generating a hologram comprising a first data image and said first orientation image using said data beam and said write reference beam; and
   encoding said hologram comprising a first data image and said first orientation image in a holographic data storage medium to form an encoded holographic data storage medium.

2. The method of claim 1, wherein said forming a first data beam further comprises the steps of:
   displaying said first data image on a first portion of said spatial light modulator;
   displaying said first orientation image on a second portion of said spatial light modulator, wherein said first portion differs from said second portion;
   providing a carrier beam;
   passing said carrier beam through said spatial light modulator to form said first data beam.

3. The method of claim 1, wherein said forming a first data beam further comprises the steps of:
   displaying said first data image on a first portion of said spatial light modulator;
   displaying said first orientation image on a second portion of said spatial light modulator, wherein said first portion differs from said second portion;
   providing a carrier beam;
   reflecting said carrier beam off said spatial light modulator to form said first data beam.

4. The method of claim 1, wherein:
   said forming step comprises forming a plurality of data beams, wherein each of said plurality of data beams comprises a different data image, and wherein each of said plurality of data beams comprises the same orientation image;
   said generating step comprises forming a plurality of holograms using said plurality of data beams and said write reference beam:
   said encoding step comprises encoding said plurality of holograms in said holographic data storage medium.

5. The method of claim 1, wherein said supplying step further comprises supplying a holographic data storage system comprising an optical detector, said method further comprising the steps of:
   providing a read reference beam using a second light source;
   providing a reference orientation image comprising a plurality of separate geometrical shapes comprising at least four different geometrical shapes;
   providing a tangential matched filter, a first rotated matched filter comprising said tangential matched filter rotated in a first direction, and a second rotated matched filter comprising said tangential matched filter rotated in a second direction;
   establishing a threshold correlation factor;
   illuminating said encoded holographic data storage medium with said read reference beam to generate a second data beam comprising a second data image and a second orientation image;
   projecting said second data beam onto said optical detector;
   calculating a first correlation factor using said second orientation image and said tangential matched filter;
   determining if said first correlation factor is greater than or equal to said threshold correlation factor;
   operative if said first correlation factor is greater than or equal to said threshold correlation factor, processing said second data image.

6. The method of claim 5, wherein said supplying step further comprises supplying an optical detector comprising an input screen, a processor, memory, microcode written to said memory, a servo comprising a rotatable shaft extending outwardly therefrom and interconnected with said input screen, wherein said threshold correlation factor, said tangential matched filter, said first rotated matched filter, and said second rotated matched filter are written to said memory.

7. The method of claim 6, wherein said processor performs said calculating a first correlation factor step and said determining if said first correlation factor is greater than or equal to said threshold correlation factor step.

8. The method of claim 5, wherein said first light source is the same as said second light source.

9. The method of claim 5, wherein said first light source is not the same as said second light source.

10. The method of claim 5, further comprising the steps of:
   calculating a second correlation factor using said second orientation image, said reference orientation image, and said first rotated matched filter;
   calculating a third correlation factor using said second orientation image, said reference orientation image, and said second rotated matched filter;
   operative if said first correlation factor is not greater or equal to than said threshold correlation factor, determining if said second correlation factor is greater than said third correlation factor;
   operative if said second correlation factor is greater than said third correlation factor, rotating said optical detector in said first direction; and operative if said second correlation factor is not greater than said third correlation factor, rotating said optical detector in said second direction.

11. The method of claim 10, wherein said supplying step further comprises supplying an optical detector comprising an input screen, a processor, memory, microcode written to said memory, a servo comprising a rotatable shaft extending outwardly therefrom and interconnected with said input screen, wherein said threshold correlation factor, said tangential matched filter, said first rotated matched filter, and said second rotated matched filter are written to said memory;
wherein said processor performs said calculating a second correlation factor step, said calculating a third correlation factor step, and said determining if said second correlation factor is greater than said third correlation factor step.

12. The method of claim 11, wherein said supplying step further comprises supplying a holographic data storage system comprising a storage controller, wherein said storage controller performs said calculating a first correlation factor step, said calculating a second correlation factor step, said calculating a third correlation factor step, said determining if said first correlation factors is greater than or equal to said threshold correlation factor, and said determining if said second correlation factor is greater than said third correlation factor step.

13. An optical detector disposed in a holographic information reading system, said optical detector comprising an input screen, a processor, a computer readable medium, a reference orientation image, a tangential partial matched filter, a first rotated partial matched filter, and a second rotated partial matched filter, encoded in said computer readable medium, computer readable program code disposed in said computer readable medium, said computer readable program code being useable with said processor to decode information encoded in a data beam, the computer readable program code comprising a series of computer readable program steps to effect:
receiving on said input screen a data beam generated by directing a reference beam onto an encoded hologram comprising a first data image and a first orientation image, said data beam comprising a projected data image and a projected orientation image, wherein said first orientation image and said projected orientation image comprises a plurality of separate geometrical shapes comprising at least four different geometrical shapes;
retrieving a pre-determined threshold correlation factor;
calculating a first correlation factor using said projected orientation image, said reference orientation image, and said tangential partial matched filter;
determining if said first correlation factor is greater than or equal to said threshold correlation factor;
operative if said first correlation factor is greater than or equal to said threshold correlation factor, processing said projected data image.

14. The optical detector of claim 13, said computer readable program code further comprising a series of computer readable program steps to effect:
calculating a second correlation factor using said projected orientation image, said reference orientation image, and said first rotated matched filter;
calculating a third correlation factor using said projected orientation image, said reference orientation image, and said second rotated matched filter.

15. The optical detector of claim 14, wherein said optical detector further comprises a servo comprising a rotatable shaft extending outwardly therefrom and interconnected with said input screen.

16. The optical detector of claim 15, said computer readable program code further comprising a series of computer readable program steps to effect:
operative if said first correlation factor is not greater than or equal to said threshold correlation factor, determining if said second correlation factor is greater than said third correlation factor;
operative if said second correlation factor is greater than said third correlation factor, rotating said input screen in said first direction; and
operative if said second correlation factor is not greater than said third correlation factor, rotating said input screen in said second direction.

17. A computer program product encoded in a non-transitory computer readable medium disposed in an optical detector disposed in a holographic information reading system, said optical detector comprising an input screen, a processor, a computer readable medium, a reference orientation image, a tangential partial matched filter, a first rotated partial matched filter, and a second rotated partial matched filter, encoded in said computer readable medium, said computer program product being useable with said processor to decode information encoded in a data beam comprising:
computer readable program code which causes said programmable computer processor to receive on said input screen a data beam generated by directing a reference beam onto an encoded hologram comprising a first data image and a first orientation image, said data beam comprising a projected data image and a projected orientation image, wherein said first orientation image and said projected orientation image comprises a plurality of separate geometrical shapes comprising at least four different geometrical shapes;
computer readable program code which causes said programmable computer processor to retrieve a pre-determined threshold correlation factor;
computer readable program code which causes said programmable computer processor to calculate a first correlation factor using said projected orientation image, said reference orientation image, and said tangential partial matched filter;
computer readable program code which causes said programmable computer processor to determine if said first correlation factor is greater than or equal to said threshold correlation factor;
computer readable program code which, if said first correlation factor is greater than said threshold correlation factor, causes said programmable computer processor to process said projected data image.

18. The computer program product of claim 17, said computer readable program code further comprising a series of computer readable program steps to effect:
computer readable program code which causes said programmable computer processor to calculate a second correlation factor using said projected orientation image, said reference orientation image, and said first rotated matched filter;
computer readable program code which causes said programmable computer processor to calculate a third correlation factor using said projected orientation image, said reference orientation image, and said second rotated matched filter.

19. The computer program product of claim 18, wherein said optical detector further comprises a servo comprising a rotatable shaft extending outwardly therefrom and interconnected with said input screen.

20. The computer program product of claim 19, further comprising:
- computer readable program code which, if said first correlation factor is not greater than or equal to said threshold correlation factor, causes said programmable computer processor to determine if said second correlation factor is greater than said third correlation factor;
- computer readable program code which, if said second correlation factor is greater than said third correlation factor, causes said programmable computer processor to rotate said input screen in said first direction; and
- computer readable program code which, if said second correlation factor is not greater than said third correlation factor, causes said programmable computer processor to rotate said input screen in said second direction.

* * * * *